United States Patent
Noguchi

(10) Patent No.: US 11,222,901 B2
(45) Date of Patent: Jan. 11, 2022

(54) SEMICONDUCTOR DEVICE AND METHOD OF FABRICATING THE SAME

(71) Applicant: TOSHIBA MEMORY CORPORATION, Tokyo (JP)

(72) Inventor: Masaki Noguchi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/291,960

(22) Filed: Mar. 4, 2019

(65) Prior Publication Data

US 2020/0091179 A1    Mar. 19, 2020

(30) Foreign Application Priority Data

Sep. 13, 2018 (JP) .............................. JP2018-171349

(51) Int. Cl.
*H01L 27/11582* (2017.01)
*H01L 27/1157* (2017.01)
*H01L 21/02* (2006.01)
*H01L 21/28* (2006.01)

(52) U.S. Cl.
CPC ...... *H01L 27/11582* (2013.01); *H01L 21/022* (2013.01); *H01L 21/0214* (2013.01); *H01L 21/02164* (2013.01); *H01L 27/1157* (2013.01); *H01L 29/40117* (2019.08)

(58) Field of Classification Search
CPC ......... H01L 29/40117; H01L 27/11582; H01L 21/0214
See application file for complete search history.

(56) References Cited

U.S. PATENT DOCUMENTS

| | | | |
|---|---|---|---|
| 6,218,700 B1 | 4/2001 | Papadas | |
| 8,254,175 B2 | 8/2012 | Higuchi et al. | |
| 9,882,018 B2 | 1/2018 | Noh et al. | |
| 2006/0033152 A1* | 2/2006 | Kim | H01L 29/40117 257/321 |
| 2014/0367763 A1* | 12/2014 | Yasuda | H01L 29/4234 257/324 |
| 2015/0371998 A1 | 12/2015 | Lue | |
| 2016/0043179 A1* | 2/2016 | Noh | H01L 27/11582 257/315 |
| 2016/0240550 A1 | 8/2016 | Jung et al. | |
| 2017/0263640 A1 | 9/2017 | Takashima et al. | |
| 2018/0204849 A1* | 7/2018 | Carlson | H01L 27/1157 |

FOREIGN PATENT DOCUMENTS

JP        H11-224910 A    8/1999

* cited by examiner

*Primary Examiner* — Sarah K Salerno
(74) *Attorney, Agent, or Firm* — Foley & Lardner LLP

(57) ABSTRACT

A semiconductor device includes a semiconductor layer, a charge storage layer provided on a surface of the semiconductor layer via a tunnel insulating film, and an electrode layer provided on a surface of the charge storage layer via a block insulating film. The tunnel insulating film includes a plurality of first silicon oxynitride films which are provided between the semiconductor layer and the charge storage layer. The tunnel insulating film further includes a silicon oxide film provided between the first silicon oxynitride films and/or a second silicon oxynitride film which is provided between the first silicon oxynitride films and has an oxygen concentration higher than an oxygen concentration in the first silicon oxynitride film.

12 Claims, 6 Drawing Sheets

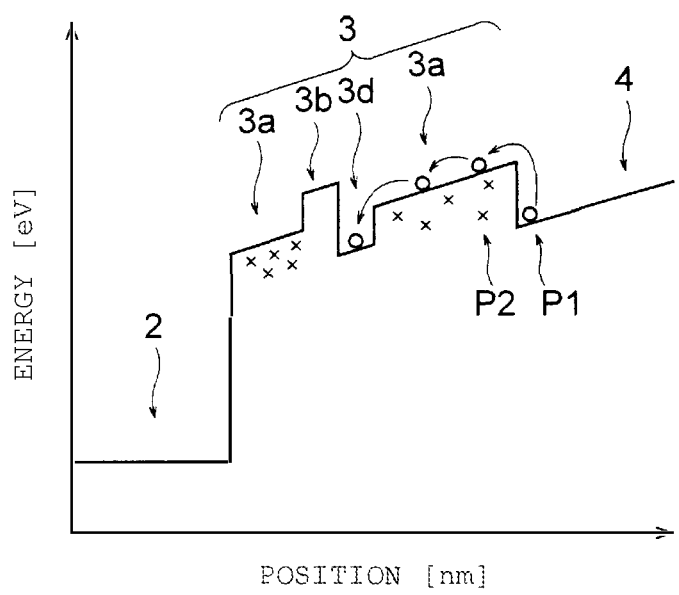

SEMICONDUCTOR DEVICE AND METHOD OF FABRICATING THE SAME

CROSS-REFERENCE TO RELATED APPLICATION

This application is based upon and claims the benefit of priority from Japanese Patent Application No. 2018-171349, filed Sep. 13, 2018, the entire contents of which are incorporated herein by reference.

FIELD

Embodiments described herein relate generally to a semiconductor device and a method of fabricating the semiconductor device.

BACKGROUND

In recent years, it is required to improve the performance of a tunnel insulating film of a semiconductor memory in order to improve a charge retention characteristic and to reduce erroneous writing in the semiconductor memory. Examples of such a semiconductor memory include a planar or three-dimensional NAND memory.

DESCRIPTION OF THE DRAWINGS

FIG. 9 is a cross-sectional view illustrating a band structure of the semiconductor device according to the fourth embodiment.

DETAILED DESCRIPTION

At least one embodiment provides a semiconductor device capable of improving a performance of a tunnel insulating film and a method of fabricating the semiconductor device.

In general, according to at least one embodiment, a semiconductor device includes a semiconductor layer, a charge storage layer provided on a surface of the semiconductor layer with a tunnel insulating film between the charge storage layer and the semiconductor layer, and an electrode layer provided on a surface of the charge storage layer with a block insulating film between the charge storage layer and the electrode layer. The tunnel insulating film includes: a plurality of first silicon oxynitride films which are provided between the semiconductor layer and the charge storage layer. The tunnel insulating film further includes a silicon oxide film provided between the first silicon oxynitride films and/or a second silicon oxynitride film provided between the first silicon oxynitride films and having an oxygen concentration higher than an oxygen concentration in the first silicon oxynitride films.

Hereinafter, embodiments of the present disclosure will be described with reference to the drawings. In FIGS. 1 to 9, the same or similar configurations are given the same reference signs, and the redundant description will be omitted.

First Embodiment

Figure 1:
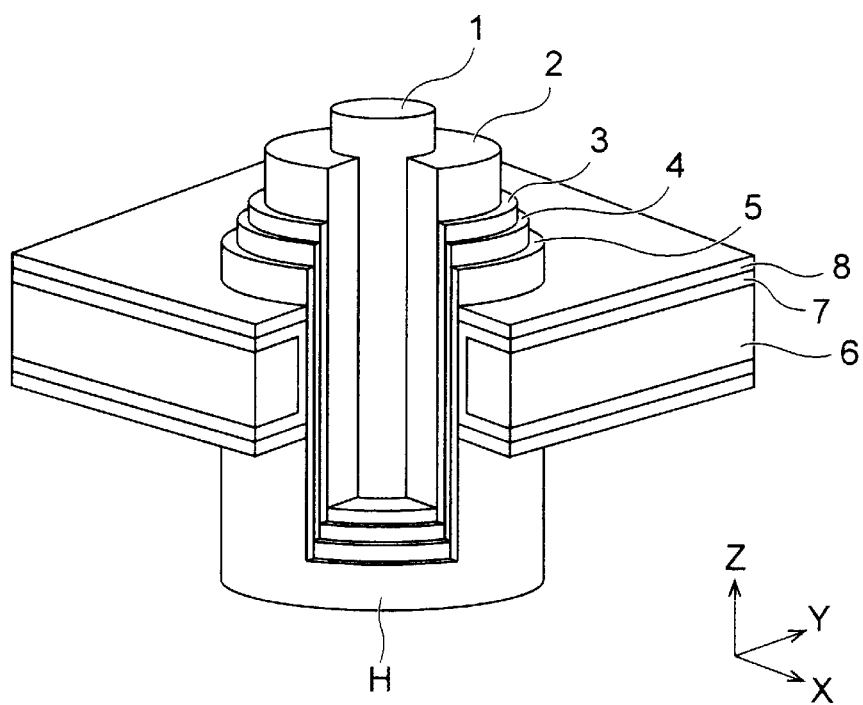
FIG. 1 is a perspective view illustrating a structure of a semiconductor device according to a first embodiment.

FIG. 1 is a perspective view illustrating a structure of a semiconductor device according to a first embodiment. The semiconductor device illustrated in FIG. 1 is, for example, a three-dimensional NAND memory.

The semiconductor device illustrated in FIG. 1 includes a core insulating film 1, a semiconductor channel layer 2, a tunnel insulating film 3, a charge storage layer 4, a block insulating film 5, an electrode material layer 6, a first metal layer 7, and a second metal layer 8.

In FIG. 1, a plurality of electrode layers and a plurality of insulating layers are stacked alternately on a substrate. A memory hole H is provided in the electrode layers and the insulating layers. In FIG. 1, X and Y directions are in parallel with a surface of the substrate and perpendicular to each other, and a Z direction is perpendicular to the surface of the substrate. In this specification, a +Z direction is an upward direction, and a −Z direction is a downward direction. The −Z direction may be matched with the direction of gravity, or may be not matched with the direction of gravity. As illustrated in FIG. 1, each electrode layer includes the electrode material layer 6, the first metal layer 7, and the second metal layer 8, and serves as a gate electrode (word line).

The core insulating film 1, the semiconductor channel layer 2, the tunnel insulating film 3, the charge storage layer 4, and the block insulating film 5 are formed inside the memory hole H, and form a memory cell. Specifically, the block insulating film 5 is formed on the surfaces of the electrode layers and the insulating layers facing inside the memory hole H. The charge storage layer 4 is formed on the surface of the block insulating film 5. The tunnel insulating film 3 is formed on the surface of the charge storage layer 4. The semiconductor channel layer 2 is formed on the surface of the tunnel insulating film 3. The core insulating film 1 is formed in the semiconductor channel layer 2.

The block insulating film 5 is, for example, a stacked film which includes an aluminum nitride film ($Al_2O_3$ film) and a silicon oxide film ($SiO_2$ film). The charge storage layer 4 is, for example, a silicon nitride film (SiN film). The tunnel insulating film 3 is, for example, a stacked film which includes a plurality of silicon oxynitride films (SiON film) and a plurality of $SiO_2$ films stacked alternately. The details of the tunnel insulating film 3 will be described below. The semiconductor channel layer 2 is, for example, a polysilicon layer. The core insulating film 1 is, for example, a $SiO_2$ film.

The electrode material layer 6, the first metal layer 7, and the second metal layer 8 are, for example, a tungsten layer (W layer), a titanium nitride film (TiN film), and an $Al_2O_3$ film, respectively. In this case, the first metal layer 7 serves as a barrier metal layer inside the electrode layer. The second metal layer 8 serves as a block insulating film together with the block insulating film 5.

Figure 2A:
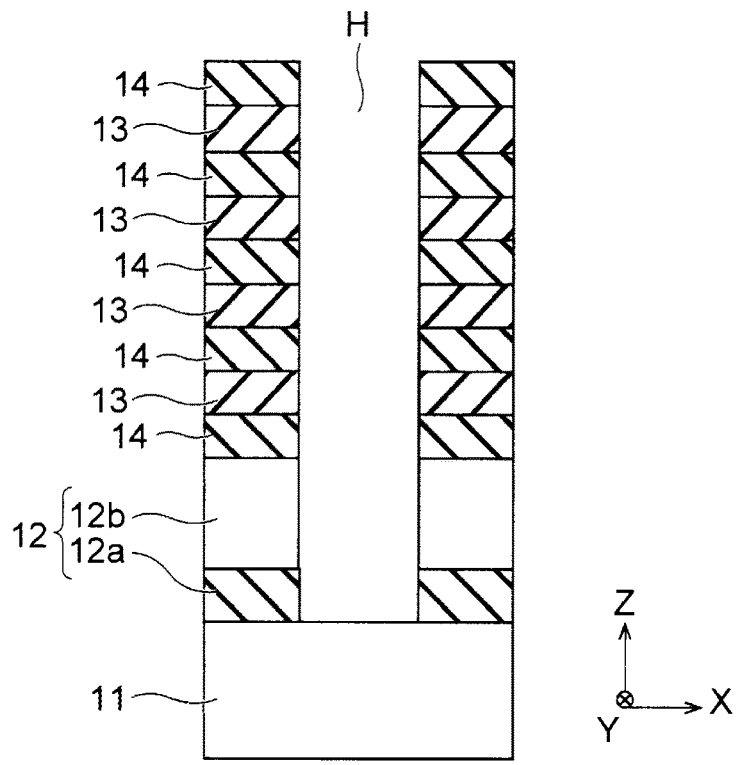
FIGS. 2A and 2B are cross-sectional views illustrating a method of fabricating the semiconductor device according to the first embodiment.
Figure 2B:
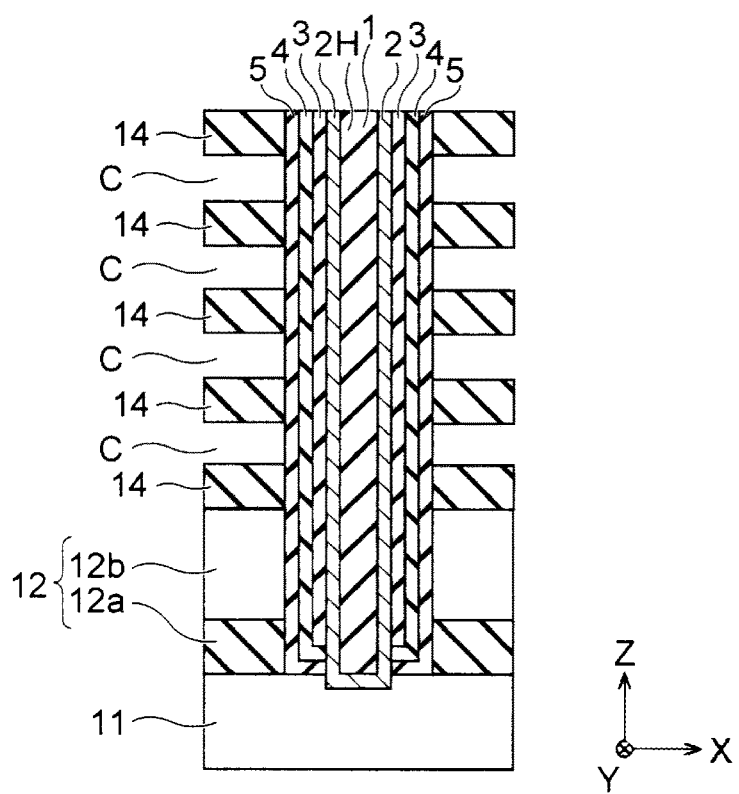

FIGS. 2A and 2B are cross-sectional views illustrating a method of fabricating the semiconductor device according to the first embodiment.

First, an under layer 12 is formed on a substrate 11. A plurality of first films 13 and a plurality of second films 14 are alternately formed on the under layer 12 (FIG. 2A). Next, the memory hole H is formed to pass through the under layer 12, the first films 13, and the second films 14 (FIG. 2A).

The substrate 11 is, for example, a semiconductor substrate such as a silicon substrate. The under layer 12 is, for example, a stacked film which includes an interlayer insulating film 12a provided on the substrate 11 and a semiconductor layer 12b provided on the interlayer insulating film 12a. An example of the interlayer insulating film 12a includes a $SiO_2$ film or a SiN film. An example of the semiconductor layer 12b includes a polysilicon layer. The first film 13 is, for example, a SiN film. The second film 14 is, for example, a $SiO_2$ film.

The second film 14 is the insulating layer described with reference to FIG. 1. The first film 13 is a sacrifice layer to form the electrode layer described with reference to FIG. 1. In this embodiment, as described below, a plurality of cavities are formed between the second films 14 by removing the first films 13. The second metal layer 8, the first metal layer 7, and the wiring material layer 6 are sequentially formed in these cavities. As a result, the plurality of electrode layers are formed inside these cavities. This process is called a replace process. Further, in a case where the replace process is not employed, the electrode layer such as the W layer may be formed as the first film 13 in the process illustrated in FIG. 2A.

Next, the block insulating film 5, the charge storage layer 4, the tunnel insulating film 3, and the semiconductor channel layer 2 are formed sequentially on the surfaces of the under layer 12, the first film 13, and the second film 14 inside the memory hole H. The remainder of the memory hole H is embedded with the core insulating film 1 (FIG. 2B). Subsequently, a groove (not illustrated) is formed in the first film 13 and the second film 14. The first film 13 is removed with a liquid chemical such as phosphoric acid, using the groove. As a result, a plurality of cavities C are formed between the second films 14 (FIG. 2B).

Specifically, the block insulating film 5, the charge storage layer 4, the tunnel insulating film 3, the semiconductor channel layer 2, and the core insulating film 1 are formed as described below. First, the block insulating film 5, the charge storage layer 4, and the tunnel insulating film 3 are sequentially formed on the surfaces of the under layer 12, the first films 13, and the second films 14 facing inside the memory hole H. Next, the block insulating film 5, the charge storage layer 4, and the tunnel insulating film 3 are removed by etching from the bottom of the memory hole H. Thereby, the substrate 11 is exposed inside the memory hole H. Subsequently, the semiconductor channel layer 2 and the core insulating film 1 are sequentially formed in the memory hole H.

Thereafter, the second metal layer 8, the first metal layer 7, and the wiring material layer 6 are sequentially formed inside the cavities C (see FIG. 1). As a result, the plurality of electrode layers are formed inside the cavities C. Accordingly, the semiconductor device illustrated in FIG. 1 is fabricated.

Figure 3:
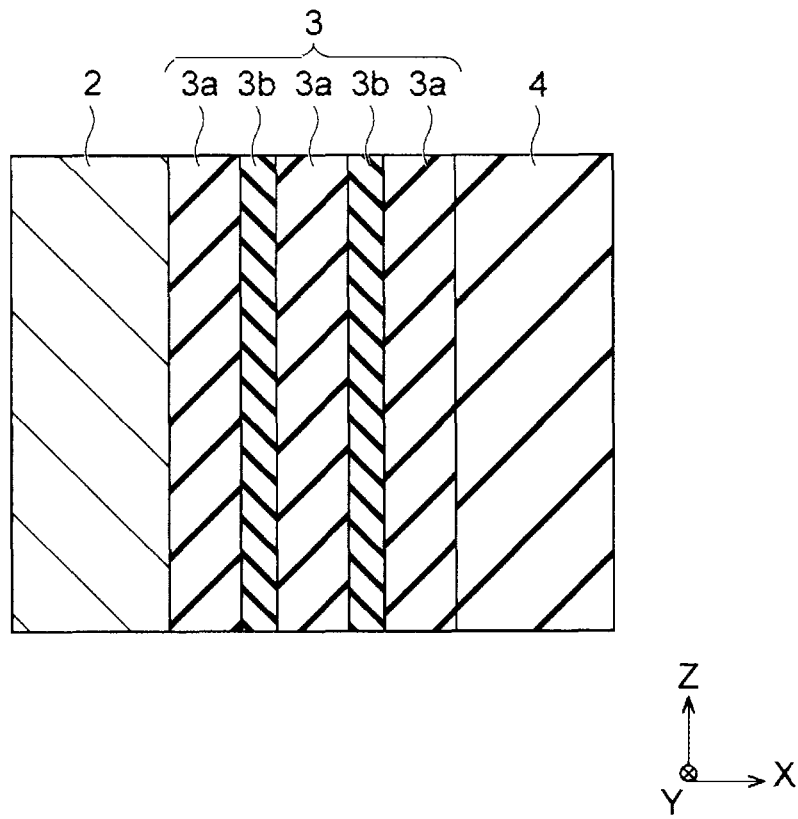
FIG. 3 is a cross-sectional view illustrating a structure of the semiconductor device according to the first embodiment.

FIG. 3 is a cross-sectional view illustrating the structure of the semiconductor device according to the first embodiment.

FIG. 3 illustrates the cross section of the semiconductor channel layer 2, the tunnel insulating film 3, and the charge storage layer 4. The tunnel insulating film 3 of this embodiment includes the plurality of SiON films 3a and the plurality of $SiO_2$ films 3b which are alternately provided between the semiconductor channel layer 2 and the charge storage layer 4. In the example illustrated in FIG. 3, the tunnel insulating film 3 includes three layers of the SiON films 3a and two layers of the $SiO_2$ films 3b.

The thickness of each SiON film 3a is, for example, 1.0 nm or more and 3.0 nm or less, and specifically is 2.0 nm here. On the other hand, the thickness of each $SiO_2$ film 3b is, for example, 0.1 nm or more and 2.0 nm or less, and specifically is 0.2 nm here. In this embodiment, the thickness of the $SiO_2$ film 3b is set to be thinner than that of the SiON film 3a.

The tunnel insulating film 3 of this embodiment is formed by alternately forming the plurality of SiON films 3a and the plurality of $SiO_2$ films 3b on the surface of the charge storage layer 4 in the process illustrated in FIG. 2A. Hereinbelow, the details of the forming method of the tunnel insulating film 3 will be described.

The tunnel insulating film 3 of this embodiment is formed by in-situ continuous deposition using a low-pressure and vertical-type batch furnace. The SiON film 3a is formed by atomic layer deposition (ALD) using $Si_2Cl_6$ gas as Si raw material gas, $O_2$ gas as an oxidizing agent, and $NH_3$ gas as a nitriding agent (Cl represents chlorine, and H represents hydrogen). Specifically, a process of sequentially supplying $Si_2Cl_6$ gas, $O_2$ gas, and $NH_3$ gas is repeatedly performed for a plurality of cycles to adjust the thickness of the SiON film 3a to be a desired thickness. Further, as long as these gases are used to form the ALD cycle, any one of $Si_2Cl_6$ gas, $O_2$ gas, and $NH_3$ gas may be supplied initially at the first cycle. A deposition temperature of the SiON film 3a is, for example, 700° C.

In at least one embodiment, the ALD sequence is changed to deposit the $SiO_2$ film 3b after depositing the SiON film 3a. Further, the SiON film 3a, the $SiO_2$ film 3b, and the SiON film 3a are sequentially deposited. The $SiO_2$ film 3b is formed by the ALD using $Si_2Cl_6$ gas as Si raw material gas and $O_3$ gas as an oxidizing agent. Specifically, the thickness of the $SiO_2$ film 3b is adjusted to be a desired thickness by repeating the process of sequentially supplying $Si_2Cl_6$ gas and $O_3$ gas for a plurality of cycles. Further, as long as these gases are used to form the ALD cycle, any one of $Si_2Cl_6$ gas and $O_3$ gas may be supplied initially at the first cycle. A deposition temperature of the $SiO_2$ film 3b is, for example, 600° C.

Further, the oxidizing agent for the $SiO_2$ film 3b may be $O_2$ gas and $H_2$ gas instead of $O_3$ gas. The $SiO_2$ film 3b may be formed by oxidizing a part of the SiON film 3a using $O_3$ gas, may be formed by radically oxidizing a part of the SiON film 3a using $O_2$ gas and $H_2$ gas, or may be formed by dry-oxidizing a part of the SiON film 3a using $O_2$ gas. In addition, the Si raw material gas for the SiON film 3a may be another gas (for example, $SiH_2Cl_2$ gas, $SiCl_4$ gas, $SiHCl_3$ gas, or the like) including Si and Cl instead of $Si_2Cl_6$ gas. In addition, the oxidizing agent for the SiON film 3a may be $NO_x$ gas instead of $O_2$ gas (X is an integer of 1 or more).

Figure 4:
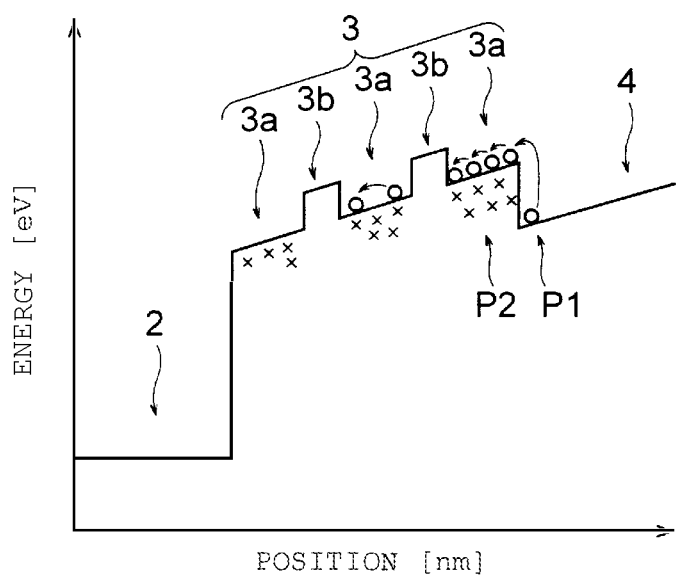
FIG. 4 is a cross-sectional view illustrating a band structure of the semiconductor device according to the first embodiment.

FIG. 4 is a cross-sectional view illustrating a band structure of the semiconductor device of the first embodiment.

FIG. 4 illustrates a positional dependency of electronic energy in the semiconductor channel layer 2, the tunnel insulating film 3, and the charge storage layer 4 when the memory cell retains charges. Reference sign P1 indicates electrons, and reference sign P2 indicates a charge trapping site inside the SiON film 3a.

The electrons in the charge storage layer 4 are applied with a force to be directed from the charge storage layer 4 to the semiconductor channel layer 2 due to the charge trapping site in the SiON film 3a. Accordingly, the electrons may fall off from the charge storage layer 4 to the semiconductor channel layer 2.

Therefore, in at least one embodiment, the $SiO_2$ film 3b is provided between the SiON films 3a. With the $SiO_2$ film 3b provided, it is possible to reduce the trapping site near the boundary between the SiON film 3a and the $SiO_2$ film 3b whereby the movement of the electrons from the charge storage layer 4 to the semiconductor channel layer 2 is inhibited by the $SiO_2$ film 3b. In addition, since the $SiO_2$ film 3b is provided by a plurality of layers, it is possible to further reduce the trapping site. With this configuration, it is possible to improve a charge retention characteristic of the memory cell.

This mechanism is considered to be established in the same manner even at the time of writing data to the memory cell and at the time of erasing data from the memory cell. Therefore, by providing the $SiO_2$ film 3b between the SiON films 3a, it is possible to reduce erroneous writing at the time of writing data to the memory cell and at the time of reading data from the memory cell.

As described above, according to at least one embodiment, the performance of the tunnel insulating film 3 can be improved by employing a tunnel insulating film 3 in which the plurality of SiON films 3a and the plurality of $SiO_2$ films 3b are alternated.

In at least one embodiment, the tunnel insulating film 3 includes three layers of the SiON films 3a and two layers of the $SiO_2$ films 3b. However, the tunnel insulating film 3 may instead include N+1 layers of the SiON films 3a and N layers of the $SiO_2$ films 3b (N is an integer of 3 or more), or may include the two layers of SiON films 3a and one layer of the $SiO_2$ film 3b.

In addition, this embodiment is applicable to a planar NAND memory, for example. In this case, the memory cell is formed by sequentially forming the tunnel insulating film 3, the charge storage layer 4, the block insulating film 5, and the electrode material layer 6 on the upper surface of the substrate 11. The substrate 11 serves as a semiconductor channel layer, and the electrode material layer 6 serves as a gate electrode (word line). In this case, the tunnel insulating film 3 is formed by alternately forming the plurality of SiON films 3a and the plurality of $SiO_2$ films 3b on the upper surface of the substrate 11.

Second Embodiment

Figure 5:
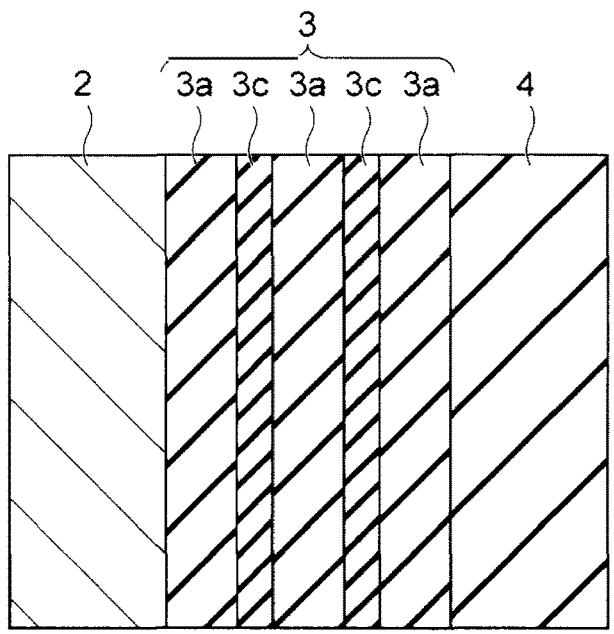
FIG. 5 is a cross-sectional view illustrating a structure of a semiconductor device according to a second embodiment.
Figure 5:
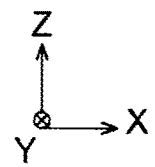

FIG. 5 is a cross-sectional view illustrating a structure of a semiconductor device according to a second embodiment.

In this embodiment, the $SiO_2$ film 3b illustrated in FIG. 3 is replaced with an O-rich SiON film 3c. The O-rich SiON film 3c is a SiON film which contains oxygen atoms at a high concentration compared to the SiON film 3a. Hereinbelow, the SiON film 3a will be denoted as a "first SiON film 3a", and the O-rich SiON film 3c will be denoted as a "second SiON film 3c". The oxygen concentration in the first SiON film 3a is, for example, 46%. The oxygen concentration in the second SiON film 3c is, for example, 49% or more.

The tunnel insulating film 3 in at least one embodiment includes a plurality of first SiON films 3a and a plurality of second SiON films 3c which are alternately provided between the semiconductor channel layer 2 and the charge storage layer 4. In the example illustrated in FIG. 5, the tunnel insulating film 3 includes three layers of the first SiON films 3a and two layers of the second SiON films 3c. The details (the film thickness, the fabricating method, or the like) of the first SiON film 3a and the $SiO_2$ film 3b described in the first embodiment are applicable even to the first SiON film 3a and the second SiON film 3c of the second embodiment if the $SiO_2$ film 3b is replaced with the second SiON film 3c.

As described above, the second SiON film 3c contains oxygen atoms at a high concentration compared to the first SiON film 3a. In other words, the oxygen concentration in the second SiON film 3c is set to be higher than that of the oxygen atoms in the first SiON film 3a. As a result, the second SiON film 3c has a characteristic closer to the $SiO_2$ film than the first SiON film 3a. Therefore, the improvement of the performance of the tunnel insulating film 3 described with reference to FIG. 4 can be achieved even in the tunnel insulating film 3 of this embodiment.

In general, the forming of the second SiON film 3c on the surface of the first SiON film 3a is easier than the forming of the $SiO_2$ film 3b on the surface of the first SiON film 3a. Therefore, according to the second embodiment, it is possible to easily form the tunnel insulating film 3 with a high performance.

Further, the structure of the tunnel insulating film 3 of the first embodiment and the structure of the tunnel insulating film 3 of the second embodiment may be combined. For example, the tunnel insulating film 3 may be formed by sequentially forming the first SiON film 3a, the $SiO_2$ film 3b, the first SiON film 3a, the second SiON film 3c, and the first SiON film 3a on the surface of the charge storage layer 4.

Third Embodiment

Figure 6:
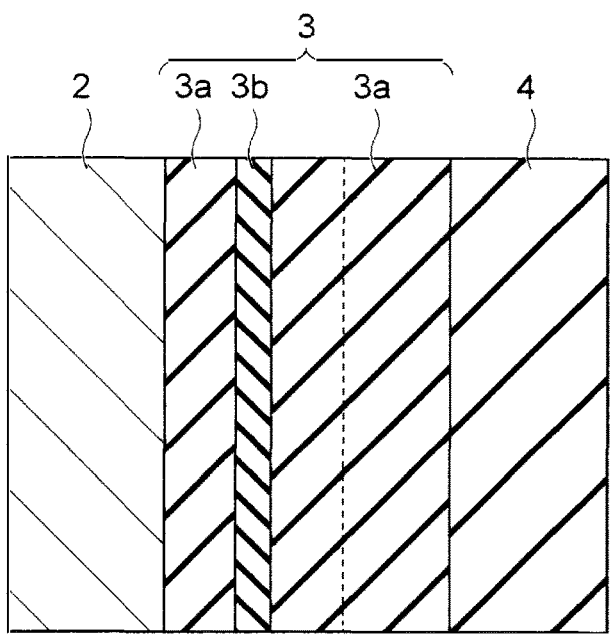
FIG. 6 is a cross-sectional view illustrating a structure of a semiconductor device according to a third embodiment.
Figure 6:
Figure 6:
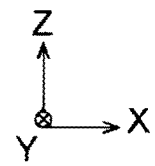

FIG. 6 is a cross-sectional view illustrating a structure of a semiconductor device according to a third embodiment.

The tunnel insulating film 3 of this embodiment includes two layers of the SiON films 3a and one layer of the $SiO_2$ film 3b which is provided between the SiON films 3a. The $SiO_2$ film 3b may be replaced with the O-rich SiON film 3c. Further, the tunnel insulating film 3 of this embodiment may include three or more layers of the SiON films 3a and two or more layers of the $SiO_2$ films 3b (or the O-rich SiON films 3c of two or more layers) which are provided alternately with the SiON films 3a.

Reference sign S indicates a curved surface which is located inside the tunnel insulating film 3 and at a predetermined distance from the semiconductor channel layer 2. On the side of the curved surface S toward the semiconductor channel layer 2, the distance to the semiconductor channel layer 2 is shorter than the electron tunnel distance from the semiconductor channel layer 2, and shorter than the hole tunnel distance from the semiconductor channel layer 2. The $SiO_2$ film 3b of this embodiment is located on the side of the curved surface S toward the semiconductor channel layer 2. Therefore, the distance to the $SiO_2$ film 3b from the semiconductor channel layer 2 in this embodiment is shorter than the electron tunnel distance and the hole tunnel distance from the semiconductor channel layer 2.

Figure 7A:
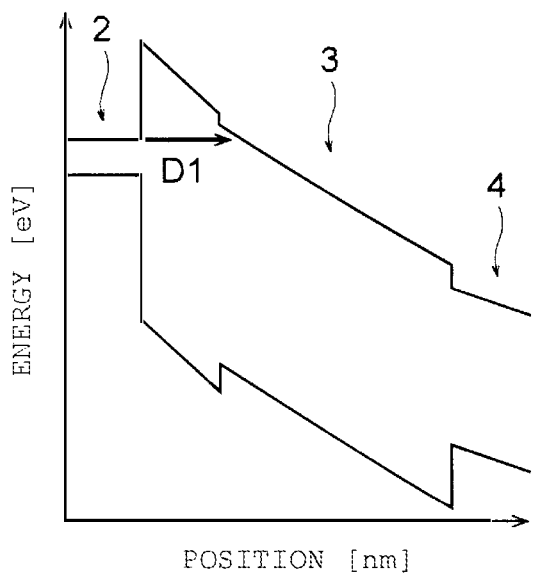
FIGS. 7A and 7B are cross-sectional views illustrating a band structure of the semiconductor device according to the third embodiment.
Figure 7B:
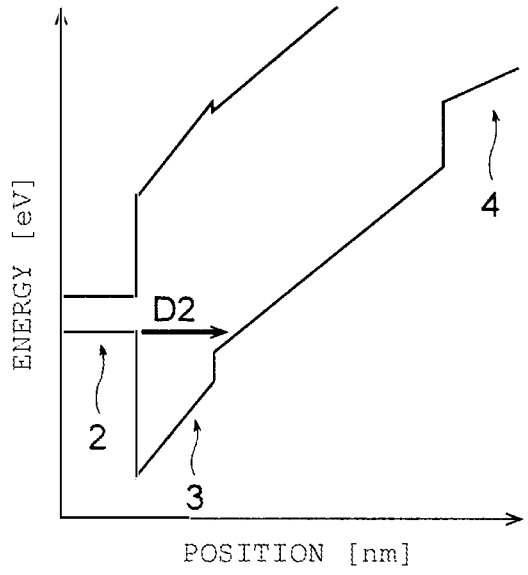

FIGS. 7A and 7B are cross-sectional views illustrating a band structure of the semiconductor device according to the third embodiment.

FIG. 7A illustrates the band structure inside the semiconductor channel layer 2, the tunnel insulating film 3, and the charge storage layer 4 at the time of writing data to the memory cell (at the time of injecting electrons). Reference sign D1 indicates the electron tunnel distance.

FIG. 7B illustrates the band structure inside the semiconductor channel layer 2, the tunnel insulating film 3, and the charge storage layer 4 at the time of erasing data from the memory cell (at the time of injecting holes). Reference sign D2 indicates the hole tunnel distance.

In a case where the distance D1 is shorter than the distance D2, the curved surface S is located at a point of the distance D1. On the other hand, in a case where the distance D2 is shorter than the distance D1, the curved surface S is located at a point of the distance D2.

According to at least one embodiment, the distance between the semiconductor channel layer 2 and the $SiO_2$ film 3b is set to be shorter than the electron tunnel distance and the hole tunnel distance from the semiconductor channel layer 2. Therefore, it is possible to improve reliability of the memory cell without increasing a write voltage or an erase voltage, for example. The structure of this embodiment may be employed in a case where the thickness of the $SiO_2$ film 3b is needed to be set as thick as possible.

Even if the distance between the semiconductor channel layer 2 and the $SiO_2$ film 3b is changed, the electron tunnel distance and the hole tunnel distance from the semiconductor channel layer 2 are not changed. In addition, the tunnel insulating film 3 of at least one embodiment may be formed from the SiON film 3a in the whole region on the side of the curved surface S toward the semiconductor channel layer 2.

Fourth Embodiment

Figure 8:
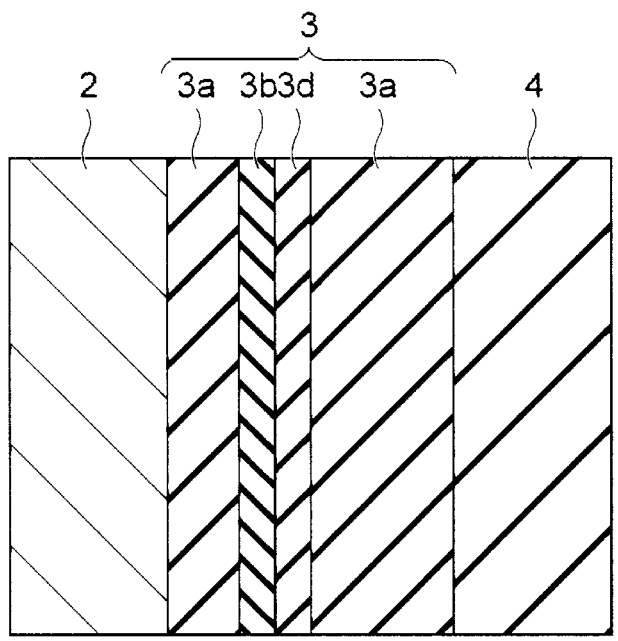
FIG. 8 is a cross-sectional view illustrating a structure of a semiconductor device according to a fourth embodiment.
Figure 8:
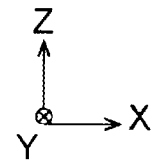

FIG. 8 is a cross-sectional view illustrating a structure of a semiconductor device according to a fourth embodiment.

The tunnel insulating film 3 of at least one embodiment includes two layers of the SiON films 3a, one layer of the $SiO_2$ film 3b which is provided between the SiON films 3a, and an N-rich SiON film 3d which is provided between one SiON film 3a and the $SiO_2$ film 3b. The N-rich SiON film 3d is a SiON film which contains nitride atoms at a higher concentration than the SiON film 3a. The $SiO_2$ film 3b may be replaced with the O-rich SiON film 3c. Hereinbelow, the SiON film 3a may be denoted as the "first SiON film 3a" again, and the N-rich SiON film 3d may be denoted as a "third SiON film 3d". The nitride concentration in the first SiON film 3a is, for example, 18%. The nitride concentration in the third SiON film 3d is, for example, 20% or more.

As described above, the third SiON film 3d contains the nitride atoms at a higher concentration than the first SiON film 3a. In other words, the nitride concentration in the third SiON film 3d is set to be higher than that of the nitride atoms in the first SiON film 3a. As a result, the third SiON film 3d has a characteristic closer to a SiN film than to the first SiON film 3a. The third SiON film 3d of at least one embodiment is provided on the side of the $SiO_2$ film 3b toward the charge storage layer 4, and comes into contact with the surface of the $SiO_2$ film 3b. In other words, the $SiO_2$ film 3b and the third SiON film 3d of this embodiment are contiguous layers.

FIG. 9 is a cross-sectional view illustrating a band structure of the semiconductor device according to the fourth embodiment.

FIG. 9 illustrates a positional dependency of electronic energy in the semiconductor channel layer 2, the tunnel insulating film 3, and the charge storage layer 4 when the memory cell retains charges. Reference sign P1 indicates electrons, and reference sign P2 indicates a charge trapping site inside the first SiON film 3a.

According to at least one embodiment, as illustrated in FIG. 9, a step of barrier heights (recess) is emphasized by the $SiO_2$ film 3b and the third SiON film 3d. With this configuration, the electrons do not readily fall off from the charge storage layer 4 to the semiconductor channel layer 2.

In this way, according to at least one embodiment, since the $SiO_2$ film 3b and the third SiON film 3d are provided between the first SiON films 3a, it is possible to further improve the performance of the tunnel insulating film 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a stacked body including a plurality of insulating layers and a plurality of electrode layers that are alternately stacked in a first direction;
    a semiconductor layer extending through the stacked body in the first direction;
    a charge storage layer disposed on a surface of the semiconductor layer with a tunnel insulating film between the charge storage layer and the semiconductor layer; and
    a block insulating film between the charge storage layer and one of the electrode layers, wherein
    the tunnel insulating film includes:
        a first silicon oxynitride film being in contact with the semiconductor layer;
        a first oxide-rich film being in contact with the first silicon oxynitride film and having an oxygen concentration higher than an oxygen concentration in the first silicon oxynitride film;
        a second silicon oxynitride film being in contact with the first oxide-rich film;
        a second oxide-rich film being in contact with the second silicon oxynitride film and having an oxygen concentration higher than the oxygen concentration in the first silicon oxynitride film; and
        a third silicon oxynitride film being in contact with the second oxide-rich film.

2. The semiconductor device according to claim 1, wherein
    a thickness of each of the first and second oxide-rich films is thinner than a thickness of each of the first through third silicon oxynitride films.

3. The semiconductor device according to claim 1, wherein
    a thickness of each of the first and second oxide-rich films is thinner than a thickness of each of the first through third silicon oxynitride films.

4. The semiconductor device according to claim 1, wherein
    a thickness of each of the first and second oxide-rich films is 0.1 nm or more, and 2.0 nm or less.

5. The semiconductor device according to claim 1, wherein
    a thickness of each of the first and second oxide-rich films is 0.1 nm or more, and 2.0 nm or less.

6. The semiconductor device according to claim 1, wherein
   a distance between the first or second oxide-rich film and the semiconductor layer is shorter than an electron tunnel distance and a hole tunnel distance from the semiconductor layer.

7. The semiconductor device according to claim 1, wherein
   the tunnel insulating film further includes a third silicon oxynitride film provided between the first silicon oxynitride films and having a nitride concentration higher than a nitride concentration in the first silicon oxynitride films.

8. The semiconductor device according to claim 7, wherein
   the third silicon oxynitride film is provided on the side of the silicon oxide film or the second silicon oxynitride film toward the charge storage layer, and contacts a surface of the silicon oxide film or the second silicon oxynitride film.

9. The semiconductor device according to claim 1, wherein
   the tunnel insulating film further includes a third silicon oxynitride film provided between the first silicon oxynitride films and having a nitride concentration higher than a nitride concentration in the first silicon oxynitride film.

10. The semiconductor device according to claim 9, wherein
    the third silicon oxynitride film is provided on the side of the silicon oxide film or the second silicon oxynitride film toward the charge storage layer, and contacts a surface of the silicon oxide film or the second silicon oxynitride film.

11. The semiconductor device according to claim 1, wherein the tunnel insulating film also extends through the stacked body in the first direction.

12. The semiconductor device according to claim 1, wherein each of the first through third silicon oxynitride films and the first through second oxide-rich films includes SiON.

* * * * *